United States Patent
Greenberg et al.

(10) Patent No.: US 8,012,610 B2
(45) Date of Patent: *Sep. 6, 2011

(54) VISIBLE-LIGHT-RESPONSIVE PHOTOACTIVE COATING, COATED ARTICLE, AND METHOD OF MAKING SAME

(75) Inventors: Charles B. Greenberg, Murrysville, PA (US); Janos Szanyi, Richland, WA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/786,989

(22) Filed: May 25, 2010

(65) Prior Publication Data

US 2010/0233473 A1    Sep. 16, 2010

Related U.S. Application Data (60) Division of application No. 11/493,414, filed on Jul. 26, 2006, now Pat. No. 7,749,621, which is a division of application No. 10/193,446, filed on Jul. 11, 2002, now Pat. No. 7,096,692, which is a continuation-in-part of application No. 10/075,316, filed on Feb. 14, 2002, now Pat. No. 6,722,159, which is a division of application No. 09/282,943, filed on Apr. 1, 1999, now Pat. No. 6,413,581, which is a division of application No. 08/899,257, filed on Jul. 23, 1997, now Pat. No. 6,027,766.

(60) Provisional application No. 60/040,566, filed on Mar. 14, 1997, provisional application No. 60/305,057, filed on Jul. 13, 2001.

(51) Int. Cl.
*B32B 15/00* (2006.01)
*B32B 17/06* (2006.01)

(52) U.S. Cl. ........ 428/697; 428/410; 428/689; 428/701; 428/702; 428/336; 428/457; 428/433

(58) Field of Classification Search .................. None
See application file for complete search history.

(56) References Cited

U.S. PATENT DOCUMENTS

| | | | | |
|---|---|---|---|---|
| 6,027,766 A * | 2/2000 | Greenberg et al. | ........... | 427/226 |
| 6,413,581 B1 * | 7/2002 | Greenberg et al. | ........... | 427/226 |
| 7,749,621 B2 * | 7/2010 | Greenberg et al. | ........... | 428/697 |

* cited by examiner

*Primary Examiner* — Ling Xu
(74) *Attorney, Agent, or Firm* — Andrew C. Siminerio (57) ABSTRACT

An article includes a substrate having an inner surface and an outer surface. A coating is deposited directly on at least a portion of the substrate outer surface. The coating consists essentially of titania and at least one additional photoabsorption band modifying material selected from vanadium (V), manganese (Mn), magnesium (Mg), scandium (Sc), yttrium (Y), niobium (Nb), molybdenum (Mo), ruthenium (Ru), lead (Pb), nickel (Ni), rhenium (Re), and mixtures thereof. The coating is a substantially non-porous CVD or MSVD coating and an outer surface of the coating is exposed to the environment.

11 Claims, 2 Drawing Sheets

VISIBLE-LIGHT-RESPONSIVE PHOTOACTIVE COATING, COATED ARTICLE, AND METHOD OF MAKING SAME

CROSS-REFERENCE TO RELATED APPLICATIONS

This application is a continuation of U.S. application Ser. No. 11/493,414, filed Jul. 26, 2006 (now U.S. Pat. No. 7,749, 621), which is a divisional of U.S. application Ser. No. 10/193,446, filed Jul. 11, 2002 (now U.S. Pat. No. 7,096,692), which is a continuation-in-part of U.S. application Ser. No. 10/075,316 to Greenberg et al., entitled "Photocatalytically-Activated Self-Cleaning Appliances", filed Feb. 14, 2002 (now U.S. Pat. No. 6,722,159), which is a divisional of U.S. application Ser. No. 09/282,943 filed Apr. 1, 1999 (now U.S. Pat. No. 6,413,581), which is a divisional of U.S. application Ser. No. 08/899,257, filed Jul. 23, 1997 (now U.S. Pat. No. 6,027,766), which claimed the benefit of U.S. Provisional Application Ser. No. 60/040,566, filed Mar. 14, 1997, all of which applications are herein incorporated by reference in their entirety. This application also claims the benefit of U.S. Provisional Application Ser. No. 60/305,057 filed Jul. 13, 2001, which is herein incorporated by reference in its entirety.

FIELD OF THE INVENTION

The present invention relates to methods of depositing photoactive coatings on a substrate (e.g., a glass sheet or a continuous float glass ribbon), to methods of making photocatalytic and/or hydrophilic coatings that exhibit photoactivity upon irradiation with visible light, and to articles of manufacture prepared according to the methods.

TECHNICAL CONSIDERATIONS

For many substrates, e.g., glass substrates such as architectural windows, automotive transparencies, and aircraft windows, it is desirable for good visibility that the surface of the substrate is substantially free of surface contaminants, such as common organic and inorganic surface contaminants, for as long a duration as possible. Traditionally, this has meant that these surfaces are cleaned frequently. This cleaning operation is typically performed by manually wiping the surface with or without the aid of chemical cleaning solutions. This approach can be labor, time, and/or cost intensive. Therefore, a need exists for substrates, particularly glass substrates, having surfaces that are easier to clean than existing glass substrates and which reduce the need or frequency for such manual cleaning.

It is known that some semiconductor metal oxides can provide a photoactive (hereinafter "PA") coating. The terms "photoactive" or "photoactively" refer to the photogeneration of a hole-electron pair when illuminated by radiation of a particular frequency, usually ultraviolet ("UV") light. Above a certain minimum thickness, these PA coatings are typically photocatalytic (hereinafter "PC"). By "photocatalytic" is meant a coating having self-cleaning properties, i.e., a coating which upon exposure to certain electromagnetic radiation, such as UV, interacts with organic contaminants on the coating surface to degrade or decompose the organic contaminants. In addition to their self-cleaning properties, these PC coatings are also typically hydrophilic, i.e. water wetting with a contact angle with water of generally less than 20 degrees. The hydrophilicity of the PC coatings helps reduce fogging, i.e. the accumulation of water droplets on the coating, which fogging can decrease visible light transmission and visibility through the coated substrate.

A problem with these conventional PC coatings is that they typically exhibit photoactivity or photocatalysis only upon exposure to ultraviolet (UV) light in wavelengths shorter than about 380 nanometers (nm). This means that the PC coatings make use of only about 3% to 5% of the solar energy that reaches the earth, which can necessitate the use of a UV light source (such as a conventional mercury or black lamp) in order to provide sufficient energy for photocatalysis.

In order to address this problem, attempts have been made to modify conventional PC coatings to shift the photoabsorption band of the coating material from the UV region into the visible region (400 nm to 800 nm) of the electromagnetic spectrum. For example, U.S. Pat. No. 6,077,492 to Anpo et al. discloses a method of shifting the photoabsorption band of titanium oxide photocatalysts from the UV region into the visible light region by high-energy ion implantation of selected metal ions into the photocatalyst. Subsequent investigation of this ion implantation method has determined that the photoabsorption band shift into the visible region requires not only high-energy ion implantation but also calcination in oxygen of the metal ion-implanted titanium oxide (*Use Of Visible Light. Second-Generation Titanium Oxide Photocatalysts Prepared By The Application Of An Advanced Metal Ion-Implantation Method*, M. Anpo, Pure Appl. Chem., Vol. 72, No. 9, pp. 1787-1792 (2000)). EP 1,066,878 discloses a sol-gel method of doping titania with minute amounts of selected metal ions to shift the photoabsorption band of the titania into the visible region.

However, these ion implantation and sol-gel coating methods are not economically or practically compatible with certain application conditions or substrates. For example, in a conventional float glass process, the float glass ribbon in the molten metal bath can be too hot to accept the sol due to evaporation or chemical reaction of the solvent used in the sol. Conversely, when the sol is applied to substrates that are below a specific temperature for the formation of crystalline forms of the catalyst, the sol-coated substrates are reheated. Reheating to a temperature sufficient to calcinate the coating or form the crystallized photocatalyst can require a substantial investment in equipment, energy, and handling costs, and can significantly decrease production efficiency. Further, reheating a sodium containing substrate, such as soda-lime-silica glass, to a temperature sufficient to calcinate the coating increases the opportunity for sodium ions in the substrate to migrate into the coating. This migration can result in what is conventionally referred to as "sodium ion poisoning" of the deposited coating. The presence of these sodium ions can reduce or destroy the photocatalytic activity of the PC coating. Moreover, the ion-implantation and sol-gel methods typically result in thick coatings, e.g., several microns thick, which may have an adverse effect on the optical and/or aesthetic properties of coated articles. Typically, as the thickness of the PC coating increases, the light transmittance and the reflectance of the coating go through a series of minimums and maximums due to optical interference effects. The reflected and transmitted color of the coating also varies due to these optical effects. Thus, coatings thick enough to provide the desired self-cleaning properties can have undesirable optical characteristics.

Therefore, it would be advantageous to provide a method of making a PA coating with photoabsorption in the visible region that is compatible with a conventional float glass process and/or an article made in accordance with the method which reduce or eliminate at least some of the above-described drawbacks.

SUMMARY OF THE INVENTION

A method is provided for forming a coating by depositing a precursor composition over at least a portion of a substrate surface by a CVD coating device. The precursor composition includes a photoactive coating precursor material, such as a metal oxide or semiconductor metal oxide precursor material, and a photoabsorption band modifying precursor material. In one embodiment, the coating is deposited over a float glass ribbon in a molten metal bath. In another embodiment, the coating is deposited over a float glass ribbon after exiting the molten metal bath but prior to entering a heat treatment device, such as an annealing lehr. The resultant coating is one that results in at least hydrophilicity, e.g., photoactive hydrophilicity, of a coating on a substrate and can also result in photocatalytic activity sufficient to be a photocatalytic coating.

Another method of forming a photoactive coating having a photoabsorption band in the visible region of the electromagnetic spectrum includes depositing a precursor composition over at least a portion of a float glass ribbon in a molten metal bath by a CVD coating device. The precursor composition includes at least one titania precursor material. In one embodiment, the titania precursor material includes titanium and oxygen, e.g., an alkoxide, such as but not limited to titanium methoxides, ethoxides, propoxides, butoxides, and the like or isomers thereof, such as but not limited to titanium isopropoxide, tetraethoxide, and the like. In another embodiment, the titania precursor material comprises titanium tetrachloride. The precursor composition also includes at least one other precursor material having a metal selected from chromium (Cr), vanadium (V), manganese (Mn), copper (Cu), iron (Fe), magnesium (Mg), scandium (Sc), yttrium (Y), niobium (Nb), molybdenum (Mo), ruthenium (Ru), tungsten (W), silver (Ag), lead (Pb), nickel (Ni), rhenium (Re), or any mixtures or combinations containing one or more thereof. In one embodiment, the other precursor material can be an oxide, alkoxide, or mixtures thereof. All root mean square roughness values are those determinable by atomic force microscopy by measurement of the root mean square (RMS) roughness over a surface area of one square micrometer. Additionally, any reference "incorporated herein" is to be understood as being incorporated in its entirety.

An additional method of the invention includes depositing a sodium ion diffusion barrier layer over at least a portion of a substrate, depositing a photoactive coating over the barrier layer, and implanting one or more selected metal ions into the photoactive coating by ion-implantation to form a photoactive coating having an absorption band including at least one wavelength in the range of 400 nm to 800 nm.

An article of the invention includes a substrate having at least one surface and a coating deposited over at least a portion of the substrate surface. The coating includes a photoactive coating material, such as titania, and at least one additional material selected from chromium (Cr), vanadium (V), manganese (Mn), copper (Cu), iron (Fe), magnesium (Mg), scandium (Sc), yttrium (Y), niobium (Nb), molybdenum (Mo), ruthenium (Ru), tungsten (W), silver (Ag), lead (Pb), nickel (Ni), rhenium (Re), or any mixtures or combinations containing one or more thereof. In one embodiment, the coating is deposited over the substrate by chemical vapor deposition.

A further article comprises a substrate having an inner surface and an outer surface. A coating is deposited directly on at least a portion of the substrate outer surface. The coating consists essentially of titania and at least one additional photoabsorption band modifying material selected from vanadium (V), manganese (Mn), magnesium (Mg), scandium (Sc), yttrium (Y), niobium (Nb), molybdenum (Mo), ruthenium (Ru), lead (Pb), nickel (Ni), rhenium (Re), and mixtures thereof. The coating is a substantially non-porous CVD or MSVD coating and an outer surface of the coating is exposed to the environment.

A transparency comprises a substrate having an inner surface and an outer surface. The substrate is selected from annealed glass, tempered glass, and heat strengthened glass. A photoactive coating is deposited directly on at least a portion of the substrate outer surface. The photoactive coating is a substantially non-porous CVD or MSVD coating. The photoactive coating consists essentially of titania and at least one additional photoabsorption band modifying material selected from chromium (Cr), vanadium (V), manganese (Mn), copper (Cu), iron (Fe), magnesium (Mg), scandium (Sc), yttrium (Y), niobium (Nb), molybdenum (Mo), ruthenium (Ru), tungsten (W), silver (Ag), lead (Pb), nickel (Ni), rhenium (Re), and mixtures thereof. An outer surface of the coating is exposed to the environment. A photoabsorption band of the photoactive coating extends at least partly into the range of 400 nm to 800 nm of the electromagnetic spectrum.

DESCRIPTION OF THE INVENTION

As used herein, spatial or directional terms, such as "inner", "outer", "above", "below", "top", "bottom", and the like, relate to the invention as it is shown in the drawing figures. However, it is to be understood that the invention can assume various alternative orientations and, accordingly, such terms are not to be considered as limiting. Further, all numbers expressing dimensions, physical characteristics, processing parameters, quantities of ingredients, reaction conditions, and the like used in the specification and claims are to be understood as being modified in all instances by the term "about". Accordingly, unless indicated to the contrary, the numerical values set forth in the following specification and claims are approximations that can vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 5.5 to 10. Further, as used herein, the terms "deposited over" or "provided over" mean deposited or provided on but not necessarily in surface contact with. For example, a coating "deposited over" a substrate does not preclude the presence of one or more other coating films of the same or different composition located between the deposited coating and the substrate. Additionally, all percentages disclosed herein are "by weight" unless indicated to the contrary. All root mean square roughness values are those determinable by atomic force microscopy by measurement of the root mean square (RMS) roughness over a surface area of one square micrometer. Additionally, all references "incorporated by reference" herein are to be understood as being incorporated in their entirety.

Figure 1:
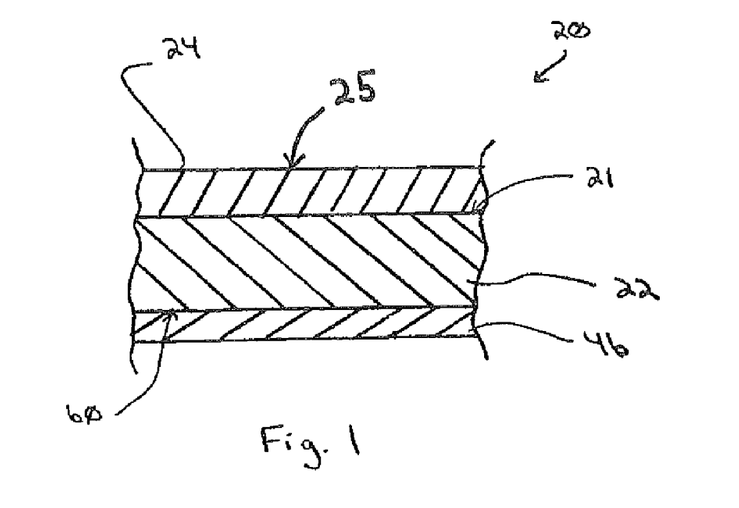
FIG. 1 is a sectional view (not to scale) of a portion of a substrate having a photoactive coating of the invention deposited thereon.

Referring now to FIG. 1, there is shown an article 20 having features of the present invention. The article 20 includes a substrate 22 having a first surface 21 and a second surface 60. The substrate 22 is not limiting to the invention and can be of any desired material having any desired characteristics, such as opaque or transparent substrates. By "transparent" is meant having a visible light transmittance of greater than 0% to 100%. By "opaque" is meant having a visible light transmittance of 0%. By "visible light" is meant electromagnetic energy having a wavelength in the range of 400 nanometers (nm) to 800 nm. Examples of suitable substrates include, but are not limited to, plastic substrates (such as polyacrylates, polycarbonates, and polyethyleneterephthalate (PET)); metal substrates; enameled or ceramic substrates; glass substrates; or mixtures or combinations thereof. For example, the substrate can be conventional untinted soda-lime-silica-glass, i.e. "clear glass", or can be tinted or otherwise colored glass, borosilicate glass, leaded glass, tempered, untempered, annealed, or heat strengthened glass. The glass can be of any type, such as conventional float glass, flat glass, or a float glass ribbon, and can be of any composition having any optical properties, e.g., any value of visible transmission, ultraviolet transmission, infrared transmission, and/or total solar energy transmission. Types of glass suitable for the practice of the invention are described, for example but not to be considered as limiting, in U.S. Pat. Nos. 4,746,347; 4,792,536; 5,240,886; 5,385,872; and 5,393,593. For example, the substrate 22 can be a float glass ribbon, a glass pane of an architectural window, a skylight, one pane of an insulating glass unit, a mirror, a shower door, glass furniture (e.g., glass tabletops, glass cabinets, etc.) or a ply for a conventional automotive windshield, side or back window, sun roof, or an aircraft transparency, just to name a few.

A photoactively-modified (hereinafter "PM") coating 24 of the invention can be deposited over at least a portion of the substrate 22, e.g., over all or a portion of a major surface of the substrate 22, such as over all or a portion of the surface 21 or the surface 60. In the illustrated embodiment, the PM coating 24 is shown on the surface 21. As used herein, the term "photoactively modified" refers to a material or coating which is photoactive and which includes at least one additive or dopant that acts to shift and/or widen the photoabsorption band of the material compared to that of the material without the additive. By "photoabsorption band" is meant the range of electromagnetic radiation absorbed by a material to render the material photoactive. The PM coating 24 can be photocatalytic, photoactively hydrophilic, or both. By "photoactively hydrophilic" is meant a coating in which the contact angle of a water droplet on the coating decreases with time as a result of exposure of the coating to electromagnetic radiation in the photoabsorption band of the material. For example, the contact angle can decrease to a value less than 15°, such as less than 10°, and can become superhydrophilic, e.g., decrease to less than 5°, after sixty minutes of exposure to radiation in the photoabsorption band of the material having an intensity of 24 W/m² at the PM coating surface. Although photoactive, the coating 24 may not necessarily be photocatalytic to the extent that it is self-cleaning, i.e., may not be sufficiently photocatalytic to decompose organic material like grime on the coating surface in a reasonable or economically useful period of time.

The PM coating 24 of the invention includes (1) a photoactive coating material and (2) an additive or dopant configured to widen or shift the photoabsorption band of the coating compared to that of the coating without the dopant material. The photoactive coating material (1) includes at least one metal oxide, such as but not limited to, one or more metal oxides or semiconductor metal oxides, such as titanium oxides, silicon oxides, aluminum oxides, iron oxides, silver oxides, cobalt oxides, chromium oxides, copper oxides, tungsten oxides, zinc oxides, zinc/tin oxides, strontium titanate, and mixtures thereof. The metal oxide can include oxides, super-oxides or sub-oxides of the metal. The metal oxide can be crystalline or at least partially crystalline. In one exemplary coating of the invention, the photoactive coating material is titanium dioxide. Titanium dioxide exists in an amorphous form and three crystalline forms, i.e., the anatase, rutile and brookite crystalline forms. The anatase phase titanium dioxide is particularly useful because it exhibits strong photoactivity while also possessing excellent resistance to chemical attack and excellent physical durability. However, the rutile phase or combinations of the anatase and/or rutile phases with the brookite and/or amorphous phases are also acceptable for the present invention.

The photoabsorption band widening or shifting material (2) can be any material that widens or shifts the photoabsorption band of the resultant coating to extend at least partly into, or extend further into, the visible region of the spectrum (i.e., widens or shifts the photoabsorption band to include at least one wavelength in the range of 400 nm to 800 nm not in the photoabsorption band of the coating without the dopant material (2)). In one exemplary embodiment, the material (2) includes at least one of chromium (Cr), vanadium (V), manganese (Mn), copper (Cu), iron (Fe), magnesium (Mg), scandium (Sc), yttrium (Y), niobium (Nb), molybdenum (Mo), ruthenium (Ru), tungsten (W), silver (Ag), lead (Pb), nickel (Ni), rhenium (Re), or any mixtures or combinations containing any one or more thereof. The material (2) is present in the PM coating 24 in an amount sufficient to widen or shift the photoabsorption band of the coating 24 to extend at least partly into, or extend further into, the visible region without adversely impacting the desired coating performance, e.g., reflectivity, transmittance, color, etc. Additionally, in the practice of the invention, the material (2) does not necessarily have to be concentrated at or near the coating surface 21 but, rather, can be deposited in such a manner that it is dispersed or incorporated into the bulk of the coating 24.

The PM coating 24 should be sufficiently thick so as to provide an acceptable level of photoactivity, e.g., photocatalytic activity and/or photoactive hydrophilicity, for a desired purpose. There is no absolute value which renders the PM coating 24 "acceptable" or "unacceptable" because whether a PM coating 24 has an acceptable level of photoactivity varies depending largely on the purpose and conditions under which the PM coated article is being used and the performance standards selected to match that purpose. However, the thickness of the PM coating 24 to achieve photoactive hydrophilicity can be much less than is needed to achieve a commercially acceptable level of photocatalytic self-cleaning activity. For example, in one embodiment the PM coating 24 can have a thickness in the range of 10 Å to 5000 Å, where thicker coatings in this range can have photocatalytic self-cleaning activity for at least some period of time as well as hydrophilicity. As the coatings get thinner in this range, photocatalytic self-cleaning activity typically decreases in relation to performance and/or duration. As coating thickness decreases in such ranges as 50 Å to 3000 Å, e.g., 100 Å to 1000 Å, e.g., 200 Å to 600 Å, e.g., 200 Å to 300 Å, photocatalytic self-cleaning activity may be immeasurable but photoactive hydrophilicity can still be present in the presence of selected electromagnetic radiation, e.g., within the photoabsorption band of the material.

In another aspect of the invention, the outer surface 25 of the PM coating 24 of the invention can be much smoother than previous self-cleaning coatings while still maintaining its photoactive hydrophilicity and/or photocatalytic activity. For example, the PM coating 24, in particular the top or outer surface 25 of the coating, can have an RMS surface roughness of less than 5 nm even for thin coatings in the above ranges, such as 200 Å to 300 Å, e.g., less than 4.9 nm, e.g., less than 4 nm, e.g., less than 3 nm, e.g., less than 2 nm, e.g., less than 1 nm e.g., 0.3 nm to 0.7 nm.

In a still further aspect of the invention, the PM coating 24 can be made denser than previous hydrophilic, self-cleaning coatings. For example, the PM coating 24 can be substantially non-porous. By "substantially non-porous" is meant that the coating is sufficiently dense that the coating can withstand a conventional hydrofluoric acid test in which a drop of 0.5 weight percent (wt. %) aqueous hydrofluoric acid (HF) solution is placed on the coating and covered with a watch glass for 8 minutes (mins) at room temperature. The HF is then rinsed off and the coating visually examined for damage. An alternative HF immersion test is described in *Industrial Engineering Chemistry & Research*, Vol. 40, No. 1, page 26, 2001 by Charles Greenberg, herein incorporated by reference. The denser PM coating 24 of the invention provides more protection to the underlying substrate against chemical attack than previous more porous self-cleaning coatings and also is harder and more scratch resistant than previous sol-gel applied self-cleaning coatings.

The PM coating 24 can be deposited directly on, i.e., in surface contact with, the surface 21 of the substrate 22 as shown in FIG. 1. Even with a sodium-containing substrate, such as soda-lime-silica glass, thin PM coatings 24 of the invention, e.g., less than 1000 Å, should not be rendered non-photoactive by sodium in the substrate when the coating is applied by the in-bath method described below. Therefore, an easier to clean soda-lime-silica glass can be made without a sodium barrier layer between the glass and the PM coating 24 of the invention. Optionally, such a barrier layer could be used.

Alternatively, one or more other layers or coatings can be interposed between the PM coating 24 and the substrate 22. For example, the PM coating 24 can be an outer or the outermost layer of a multilayer stack of coatings present on substrate 22 or the PM coating 24 can be embedded as one of the layers other than the outermost layer within such a multilayer stack. By "an outer layer" is meant a layer receiving sufficient exciting electromagnetic radiation, e.g., radiation within the photoabsorption band of the layer material, to provide the coating with sufficient photoactivity to be at least photoactively hydrophilic if not necessarily photocatalytic. In one embodiment, the PM coating 24 is the outermost coating on the substrate 22.

A PM coating 24 of the invention can be formed on the substrate 22 by any conventional method, such as ion-implantation, spray pyrolysis, chemical vapor deposition (CVD), or magnetron sputtered vacuum deposition (MSVD). In the ion-implantation method, metal ions are implanted into the coating by high voltage acceleration. In the spray pyrolysis method, an organic or metal-containing precursor composition having (1) a metal oxide precursor material, e.g., a titania precursor material, and (2) at least one photoabsorption band modifying precursor material, i.e., a dopant material (such as an organometallic precursor material), is carried in an aqueous suspension, e.g. an aqueous solution, and is directed toward the surface of the substrate 22 while the substrate 22 is at a temperature high enough to cause the precursor composition to decompose and to form a PM coating 24 on the substrate 22. In a CVD method, the precursor composition is carried in a carrier gas, e.g., nitrogen gas, and directed toward the substrate 22. In the MSVD method, one or more metal-containing cathode targets are sputtered under reduced pressure in an inert or oxygen-containing atmosphere to deposit a sputter coating over substrate 22. The substrate 22 can be heated during or after coating to cause crystallization of the sputter coating to form the PM coating 24. For example, one cathode can be sputtered to provide the metal oxide precursor material (1) and another cathode can be sputtered to provide the dopant material (2). Alternatively, a single cathode already doped with the desired dopant material can be sputtered to form the PM coating 24.

Each of the methods has advantages and limitations depending upon the desired characteristics of the PM coating 24 and the type of glass fabrication process. For example, in a conventional float glass process molten glass is poured onto a pool of molten metal, e.g., tin, in a molten metal (tin) bath to form a continuous float glass ribbon. Temperatures of the float glass ribbon in the tin bath generally range from 1203° C. (2200° F.) at the delivery end of the bath to 592° C. (1100° F.) at the exit end of the bath. The float glass ribbon is removed from the tin bath and annealed, i.e. controllably cooled, in a lehr before being cut into glass sheets of desired length and width. The temperature of the float glass ribbon between the tin bath and the annealing lehr is generally in the range of 480° C. (896° F.) to 580° C. (1076° F.) and the temperature of the float glass ribbon in the annealing lehr generally ranges from 204° C. (400° F.) to 557° C. (1035° F.) peak. U.S. Pat. Nos. 4,466,562 and 4,671,155 (hereby incorporated by reference) provide a discussion of the float glass process.

The CVD and spray pyrolysis methods may be preferred over the MSVD method in a float glass process because they are more compatible with coating continuous substrates, such as float glass ribbons, at elevated temperatures. Exemplary CVD and spray pyrolysis coating methods are described in U.S. Pat. Nos. 4,344,986; 4,393,095; 4,400,412; 4,719,126; 4,853,257; and 4,971,843, which patents are hereby incorporated by reference.

In the practice of the invention, one or more CVD coating apparatus can be employed at several points in the float glass ribbon manufacturing process. For example, CVD coating apparatus may be employed as the float glass ribbon travels through the tin bath, after it exits the tin bath, before it enters the annealing lehr, as it travels through the annealing lehr, or after it exits the annealing lehr. Because the CVD method can coat a moving float glass ribbon yet withstand the harsh environments associated with manufacturing the float glass ribbon, the CVD method is particularly well suited to provide the PM coating 24 on the float glass ribbon in the molten tin bath. U.S. Pat. Nos. 4,853,257; 4,971,843; 5,536,718; 5,464,657; 5,714,199; and 5,599,387, hereby incorporated by reference, describe CVD coating apparatus and methods that can be used in the practice of the invention to coat a float glass ribbon in a molten tin bath.

Figure 2:
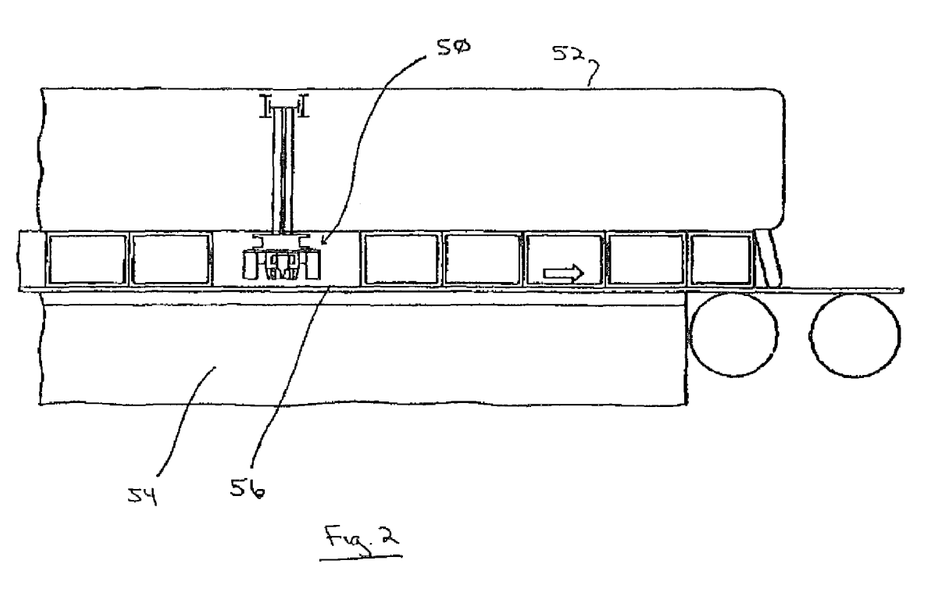
FIG. 2 is a side view (not to scale) of a coating process for applying a photoactive metal oxide coating of the invention onto a glass ribbon in a molten metal bath for a float glass process.

For example, as shown in FIG. 2, one or more CVD coaters 50 can be located in the tin bath 52 above the molten tin pool 54. As the float glass ribbon 56 moves through the tin bath 52, the vaporized precursor composition (i.e., the photoactive coating precursor material (1), e.g., metal oxide precursor material, and the photoabsorption band modifying material (2), e.g., an organometallic precursor material), can be added to a carrier gas and directed onto the top surface 21 of the ribbon 56. The precursor composition decomposes to form a PM coating 24 of the invention. The material (2) can be at least partially soluble in the coating precursor material (1), such as fully soluble in the coating precursor material (1) under the desired deposition conditions. Any desired amount of the material (2) to achieve a desired shift of the photoabsorption band into the visible region can be added to, mixed into, or solubilized in the coating precursor material (1). Alternatively, the two separate precursors can be separately vaporized and combined.

Exemplary coating precursor materials (1) (e.g., titania precursor materials) that can be used in the practice of the present invention to form titanium dioxide PM coatings 24 by the CVD method include, but are not limited to, oxides, sub-oxides, or super-oxides of titanium. In one embodiment, the precursor material (1) can include one or more titanium alkoxides, such as but not limited to titanium methoxide, ethoxide, propoxide, butoxide, and the like; or isomers thereof, e.g., titanium isopropoxide, tetraethoxide, and the like. Exemplary precursor material suitable for the practice of the invention include, but are not limited to, titanium tetraisopropoxide ($Ti(OC_3H_7)_4$) (hereinafter "TTIP") and titanium tetraethoxide ($Ti(OC_2H_5)_4$) (hereinafter "TTEt"). Alternatively, the titania precursor material (1) can be titanium tetrachloride.

The photoabsorption band shifting material (2) can be any material that shifts or widens the photoabsorption band of the resultant coating to extend at least partly into, or extend further into, the visible region (400 nm to 800 nm) of the electromagnetic spectrum. The material can include one or more of chromium (Cr), vanadium (V), manganese (Mn), copper (Cu), iron (Fe), magnesium (Mg), scandium (Sc), yttrium (Y), niobium (Nb), molybdenum (Mo), ruthenium (Ru), tungsten (W), silver (Ag), lead (Pb), nickel (Ni), rhenium (Re), and/or any mixtures or combinations thereof. For example, the precursor material (2) can be a metal oxide or alkoxide. In one embodiment, the material (2) is at least partially soluble, e.g., mostly soluble, in the precursor material (1). Exemplary carrier gases that can be used in the CVD method of the invention include but are not limited to air, nitrogen, oxygen, ammonia and mixtures thereof. The concentration of the precursor composition in the carrier gas can vary depending upon the specific precursor composition used. However, it is anticipated that for coatings having a thickness of about 200, the concentration of precursor composition in the carrier gas will typically be in the range of 0.01 volume % to 0.1 volume %, e.g., 0.01 volume % to 0.06 volume %, e.g., 0.015 volume % to 0.06 volume %; e.g., 0.019 volume % to 0.054 volume %. For thicker coatings, the precursor compositions can be higher.

For the CVD method (as well as the spray pyrolysis method discussed below), the temperature of the substrate 22 (such as a float glass ribbon 56) during formation of the PM coating 24 thereon should be within the range which will cause the metal containing precursor composition to decompose and form a coating having a desired amount of photoactivity, e.g., photocatalytic activity, photoactive hydrophilicity, or both. The lower limit of this temperature range is largely affected by the decomposition temperature of the selected precursor composition. For the above listed titanium-containing precursors, the lower temperature limit of the substrate 22 to provide sufficient decomposition of the precursor composition is generally in the range of 400° C. (752° F.) to 500° C. (932° F.). The upper limit of this temperature range can be affected by the method of coating the substrate. For example, where the substrate 22 is a float glass ribbon 56 and the PM coating 24 is applied to the float glass ribbon 56 in the molten tin bath 50 during manufacture of the float glass ribbon 56, the float glass ribbon 56 can reach temperatures in excess of 1000° C. (1832° F.). The float glass ribbon 56 can be attenuated or sized (e.g. stretched or compressed) at temperatures above 800° C. (1472° F.). If the PM coating 24 is applied to the float glass ribbon 56 before or during attenuation, the PM coating 24 can crack or crinkle as the float glass ribbon 56 is stretched or compressed respectively. Therefore, the PM coating 24 can be applied when the float glass ribbon 56 is dimensionally stable (except for thermal contraction with cooling), e.g., below 800° C. (1472° F.) for soda lime silica glass, and the float glass ribbon 56 is at a temperature to decompose the metal-containing precursor, e.g., above 400° C. (752° F.).

For spray pyrolysis, U.S. Pat. Nos. 4,719,126; 4,719,127; 4,111,150; and 3,660,061, herein incorporated by reference, describe spray pyrolysis apparatus and methods that can be used with a conventional float glass ribbon manufacturing process. While the spray pyrolysis method like the CVD method is well suited for coating a moving float glass ribbon, the spray pyrolysis has more complex equipment than the CVD equipment and is usually employed between the exit end of the tin bath and the entrance end of the annealing lehr.

Exemplary metal-containing precursor compositions that can be used in the practice of the invention to form PM coatings by the spray pyrolysis method include relatively water insoluble organometallic reactants, specifically metal acetylacetonate compounds, which are jet milled or wet ground to a particle size of less than 10 microns and suspended in an aqueous medium by the use of a chemical wetting agent. A suitable metal acetylacetonate precursor material to form a titanium dioxide containing PM coating is titanyl acetylacetonate ($TiO(C_5H_7O_2)_2$). A photoabsorption band modifying material, such as described above, can be mixed with or solubilized into the acetylacetonate precursor material. In one embodiment, the relative concentration of the metal acetylacetonate and band shifting precursor materials in the aqueous suspension ranges from 5 to 40 weight percent of the aqueous suspension. The wetting agent can be any relatively low foaming surfactant, including anionic, nonionic or cationic compositions. In one embodiment, the surfactant is nonionic. The wetting agent is typically added at 0.24% by weight, but can range from 0.01% to 1% or more. The aqueous medium can be distilled or deionized water. Aqueous suspensions for pyrolytic deposition of metal-containing films are described in U.S. Pat. No. 4,719,127 particularly at column 2, line 16, to column 4, line 48, which is herein incorporated herein by reference.

As will be appreciated by those skilled in the art, the bottom surface 60 of the float glass ribbon resting directly on the molten tin (commonly referred to as the "tin side") has diffused tin in the surface which provides the tin side with a pattern of tin absorption that is different from the opposing surface 21 not in contact with the molten tin (commonly referred to as "the air side"). The PM coating of the invention can be formed on the air side of the float glass ribbon while it is supported on the tin by the CVD method as described above, on the air side of the float glass ribbon after it leaves the tin bath by either the CVD or spray pyrolysis methods, and/or on the tin side of the float glass ribbon after it exits the tin bath by the CVD method.

As an alternative to including oxygen in the atmosphere of the tin bath to form oxide coatings, the precursor composition can itself include one or more sources of organic oxygen. The organic oxygen can be, for example, an ester or carboxylate ester, such as an alkyl ester having an alkyl group with a β-hydrogen. Suitable esters can be alkyl esters having a $C_2$ to $C_{10}$ alkyl group. Exemplary esters which can be used in the practice of the invention are described in WO 00/75087, herein incorporated by reference.

With respect to MSVD, U.S. Pat. Nos. 4,379,040; 4,861,669; 4,900,633; 4,920,006; 4,938,857; 5,328,768; and 5,492,750, herein incorporated by reference, describe MSVD apparatus and methods to sputter coat metal oxide films on a substrate, including a glass substrate. The MSVD process is not generally compatible with providing a PM coating over a float glass ribbon during its manufacture because, among other things, the MSVD process requires reduced pressure during the sputtering operation which is difficult to form over a continuous moving float glass ribbon. However, the MSVD method is acceptable to deposit the PM coating 24 on substrate 22, e.g., a glass sheet. The substrate 22 can be heated to temperatures in the range of 400° C. (752° F.) to 500° C. (932° F.) so that the MSVD sputtered coating on the substrate crystallizes during deposition process thereby eliminating a subsequent heating operation. Heating the substrate during sputtering is not a preferred method because the additional heating operation during sputtering can decrease throughput. Alternatively, the sputter coating can be crystallized within the MSVD coating apparatus directly and without post heat treatment by using a high-energy plasma, but again because of its tendency to reduce throughput through an MSVD coater, this is not a preferred method.

An exemplary method to provide a PM coating (especially a PM coating of 300 Å or less and having an RMS surface roughness of 2 nm or less) using the MSVD method is to sputter a dopant containing coating on the substrate, remove the coated substrate from the MSVD coater, and thereafter heat treat the coated substrate to crystallize the sputter coating. For example, but not limiting to the invention, a target of titanium metal doped with at least one photoabsorption band shifting material selected from chromium (Cr), vanadium (V), manganese (Mn), copper (Cu), iron (Fe), magnesium (Mg), scandium (Sc), yttrium (Y), niobium (Nb), molybdenum (Mo), ruthenium (Ru), tungsten (W), silver (Ag), lead (Pb), nickel (NI), rhenium (Re), and/or mixtures or combinations thereof can be sputtered in an argon/oxygen atmosphere having 5-50% oxygen, such as 20% oxygen, at a pressure of 5-10 millitorr to sputter deposit a doped titanium dioxide coating of desired thickness on the substrate 22. The coating as deposited is not crystallized. The coated substrate is removed from the coater and heated to a temperature in the range of 400° C. (752° F.) to 600° C. (1112° F.) for a time period sufficient to promote formation of the crystalline form of titanium dioxide to render photoactivity. In one embodiment, the substrate is heated for at least an hour at temperature in the range of 400° C. (752° F.) to 600° C. (1112° F.). Where the substrate 22 is a glass sheet cut from a float glass ribbon, the PM coating 24 can be sputter deposited on the air side and/or the tin side.

The substrate 22 having the PM coating 24 deposited by the CVD, spray pyrolysis or MSVD methods can be subsequently subjected to one or more post-coating annealing operations. As may be appreciated, the time and temperatures of the anneal can be affected by several factors, including the makeup of substrate 22, the makeup of PM coating 24, the thickness of the PM coating 24, and whether the PM coating 24 is directly in contact with the substrate 22 or is one layer of a multilayer stack on substrate 22.

Whether the PM coating 24 is provided by the CVD process, the spray pyrolysis process, or the MSVD process, where the substrate 22 includes sodium ions that can migrate from the substrate 22 into the PM coating 24 deposited on the substrate 22, the sodium ions can inhibit or destroy the photoactivity, e.g., photocatalytic activity and/or photoactive hydrophilicity, of the PM coating 24 by forming inactive compounds while consuming titanium, e.g., by forming sodium titanates or by causing recombination of photoexcited charges. Therefore, a sodium ion diffusion barrier (SIDB) layer can be deposited over the substrate before deposition of the PM coating 24. A suitable SIDB layer is discussed in detail in U.S. Pat. No. 6,027,766, herein incorporated by reference. With post-coating heating, a sodium barrier layer for sodium containing substrates, such as soda-lime-silica glass, can be utilized. For applying the PM coating 24 of the invention in a molten metal bath, the sodium barrier layer is optional.

The SIDB layer can be formed of amorphous or crystalline metal oxides including but not limited to cobalt oxides, chromium oxides and iron oxides, tin oxides, silicon oxides, titanium oxides, zirconium oxides, fluorine-doped tin oxides, aluminum oxides, magnesium oxides, zinc oxides, and mixtures thereof. Mixtures include but are not limited to magnesium/aluminum oxides and zinc/tin oxides. As can be appreciated by those skilled in the art, the metal oxide can include oxides, super-oxides or sub-oxides of the metal. While the thickness of the SIDB layer necessary to prevent sodium ion poisoning of the PM coating varies with several factors including the time period at which a substrate will be maintained at temperatures above which sodium ion migration occurs, the rate of sodium ion migration from the substrate, the rate of sodium ion migration through the SIDB layer, the thickness of the PM coating and the degree of photocatalytic activity required for a given application, typically for most applications, the SIDB layer thickness should be in the range of at least about 100 Å, such as at least about 250 Å, e.g., at least about 500 Å thick to prevent sodium ion poisoning of the PM coating layer. The SIDB layer can be deposited over substrate 22 by any conventional method, such as but not limited to CVD, spray pyrolysis, or MSVD methods. Where the spray pyrolysis or CVD methods are employed, the substrate 22 can be maintained at a temperature of at least about 400° C. (752° F.) to ensure decomposition of the metal-containing precursor to form the SIDB layer. The SIDB layer can be formed by other methods, including the sol-gel method, which sol-gel method as noted above is typically not compatible with the manufacture of a glass float ribbon.

A tin oxide SIDB layer, such as a fluorine doped tin oxide SIDB, can be deposited on a substrate by spray pyrolysis by forming an aqueous suspension of dibutyltin difluoride $(C_4H_9)_2SnF_2$ and water and applying the aqueous suspension to the substrate via spray pyrolysis. In general, the aqueous suspension typically contains between 100 to 400 grams of dibutyltin difluoride per liter of water. Wetting agents can be used as suspension enhancers. During the preparation of the aqueous suspension, the dibutyltin difluoride particles can be milled to an average particle size of 1 to 10 microns. The aqueous suspension can be vigorously agitated to provide a uniform distribution of particles in suspension. The aqueous suspension is delivered by spray pyrolysis to the surface of a substrate which is at a temperature of at least about 400° C. (752° F.), such as about 500° C. to 700° C. (932° F. to 1292° F.), whereupon the aqueous suspension pyrolyzes to form a tin oxide SIDB layer. As may be appreciated, the thickness of SIDB layer formed by this process can be controlled by, among other parameters, the coating line speed, the dibutyltin difluoride concentration in the aqueous suspension and the rate of spraying.

Alternatively the tin oxide SIDB layer can be formed by the CVD method on the substrate from a metal-containing precursor such as a monobutyltintrichloride vapor (hereinafter "MBTTCL") in an air carrier gas mixed with water vapor. The MBTTCL vapor can be present in a concentration of at least about 0.5% in the air carrier gas applied over substrate while the substrate is at a temperature sufficient to cause the deposition of a tin containing layer e.g. at least about 400° C. (952° F.), such as about 500° C. to 800° C. (932° F. to 1472° F.), to form the tin oxide SIDB layer. As may be appreciated the thickness of the SIDB layer formed by this process can be controlled by, among other parameters, the coating line speed, the concentration of MBTTCL vapor in the air carrier gas and the rate of carrier gas flow.

An SIDB layer formed by the MSVD process is described in U.S. patent application Ser. No. 08/597,543 filed Feb. 1, 1996, entitled "Alkali Metal Diffusion Barrier Layer", herein incorporated by reference, which discloses the formation of alkali metal diffusion barriers. The barrier layer disclosed therein is generally effective at thicknesses of about 20 Å to about 180 Å, with effectiveness increasing as the density of the barrier increases.

The PM coatings 24 of the present invention can be photoactive, e.g., photocatalytic and/or photoactively hydrophilic, upon exposure to radiation in the ultraviolet range, e.g., 300 nm to 400 nm, and/or visible range (400 nm to 800 nm) of the electromagnetic spectrum. Sources of ultraviolet radiation include natural sources, e.g., solar radiation, and artificial sources such as a black light or an ultraviolet light source such as a UVA-340 light source commercially available from the Q-Panel Company of Cleveland, Ohio.

As shown in FIG. 1, in addition to the PM coating 24 of the invention, one or more functional coatings 46 can be deposited on or over the substrate 22. For example, a functional coating 46 can be deposited over the major surface 60 of the substrate 22 that is opposite the surface 21. As used herein, the term "functional coating" refers to a coating which modifies one or more physical properties of the substrate on which it is deposited, e.g., optical, thermal, chemical or mechanical properties, and is not intended to be removed from the substrate during subsequent processing. The functional coating 46 can have one or more functional coating films of the same or different composition or functionality. As used herein, the terms "layer" or "film" refer to a coating region of a desired or selected coating composition. The film can be homogeneous, non-homogeneous, or have a graded compositional change. A film is "homogeneous" when the outer surface or portion (i.e., the surface or portion farthest from the substrate), the inner surface or portion (i.e., the surface or portion closest to the substrate) and the portion between the outer and inner surfaces have substantially the same composition. A film is "graded" when the film has a substantially increasing fraction of one or more components and a substantially decreasing fraction of one or more other components when moving from the inner surface to the outer surface or vice versa. A film is "non-homogeneous" when the film is other than homogeneous or graded. A "coating" is composed of one or more "films".

The functional coating 46 can be an electrically conductive coating, such as, for example, an electrically conductive heated window coating as disclosed in U.S. Pat. Nos. 5,653, 903 and 5,028,759, or a single-film or multi-film coating capable of functioning as an antenna. Likewise, the functional coating 46 can be a solar control coating, for example, a visible, infrared or ultraviolet energy reflecting or absorbing coating. Examples of suitable solar control coatings are found, for example, in U.S. Pat. Nos. 4,898,789; 5,821,001; 4,716,086; 4,610,771; 4,902,580; 4,716,086; 4,806,220; 4,898,790; 4,834,857; 4,948,677; 5,059,295; and 5,028,759, and also in U.S. patent application Ser. No. 09/058,440. Similarly, the functional coating 46 can be a low emissivity coating. "Low emissivity coatings" allow visible wavelength energy, e.g., 400 nm to about 800 nm (e.g., to about 780 nm), to be transmitted through the coating but reflect longer-wavelength solar infrared energy and/or thermal infrared energy and are typically intended to improve the thermal insulating properties of architectural glazings. By "low emissivity" is meant emissivity less than 0.4, such as less than 0.3, e.g., less than 0.2. Examples of low emissivity coatings are found, for example, in U.S. Pat. Nos. 4,952,423 and 4,504,109 and British reference GB 2,302,102. The functional coating 46 can be a single layer or multiple layer coating and can comprise one or more metals, non-metals, semi-metals, semiconductors, and/or alloys, compounds, composites, combinations, or blends thereof. For example, the functional coating 46 can be a single layer metal oxide coating, a multiple layer metal oxide coating, a non-metal oxide coating, or a multiple layer coating.

Examples of suitable functional coatings for use with the invention are commercially available from PPG Industries, Inc. of Pittsburgh, Pa. under the SUNGATE® and SOLARBAN® families of coatings. Such functional coatings typically include one or more anti-reflective coating films comprising dielectric or anti-reflective materials, such as metal oxides or oxides of metal alloys, which are preferably transparent or substantially transparent to visible light. The functional coating 46 can also include infrared reflective films comprising a reflective metal, e.g., a noble metal such as gold, copper or silver, or combinations or alloys thereof, and can further comprise a primer film or barrier film, such as titanium, as is known in the art, located over and/or under the metal reflective layer.

The functional coating 46 can be deposited in any conventional manner, such as but not limited to magnetron sputter vapor deposition (MSVD), chemical vapor deposition (CVD), spray pyrolysis (i.e., pyrolytic deposition), atmospheric pressure CVD (APCVD), low-pressure CVD (LPCVD), plasma-enhanced CVD (PEVCD), plasma assisted CVD (PACVD), thermal or electron-beam evaporation, cathodic arc deposition, plasma spray deposition, and wet chemical deposition (e.g., sol-gel, mirror silvering etc.). For example, U.S. Pat. Nos. 4,584,206, 4,900,110, and 5,714, 199, herein incorporated by reference, disclose methods and apparatus for depositing a metal containing film on the bottom surface of a glass ribbon by chemical vapor deposition. Such a known apparatus can be located downstream of the molten tin bath in the float glass process to provide a functional coating on the underside of the glass ribbon, i.e., the side opposite the PM coating of the invention. Alternatively, one or more other CVD coaters can be located in the tin bath to deposit a functional coating either above or below the PM coating 24 on the float glass ribbon. When the functional coating is applied on the PM coating side of the substrate, the functional coating can be applied in the tin bath before the PM coating. When the functional coating is on the opposite side 60 from the PM coating, the functional coating can be applied after the tin bath in the float process as discussed above, e.g., on the tin side of the substrate 22 by CVD or MSVD. In another embodiment, the PM coating 24 can be deposited over all or a portion of the surface 60 and the functional coating 46 can be deposited over all or a portion of the surface 21.

Figure 3:
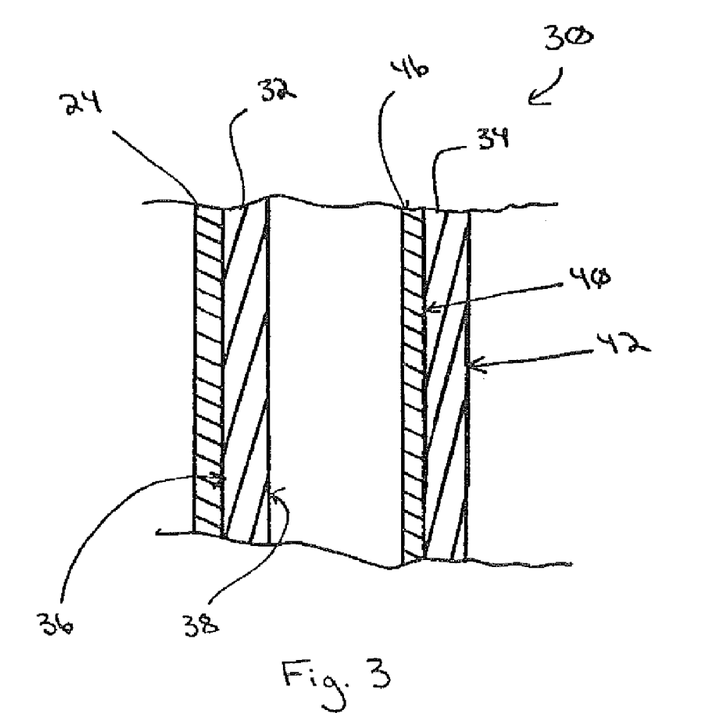
FIG. 3 is a side view (not to scale) of an insulating glass unit incorporating features of the invention.

An exemplary article of manufacture of the invention is shown in FIG. 3 in the form of an insulating glass (IG) unit 30.

The insulating glass unit has a first pane 32 spaced from a second pane 34 by a spacer assembly (not shown) and held in place by a sealant system to form a chamber between the two panes 32, 34. The first pane 32 has a first surface 36 (number 1 surface) and a second surface 38 (number 2 surface). The second pane 34 has a first surface 40 (number 3 surface) and a second surface 42 (number 4 surface). The first surface 36 can be the exterior surface of the IG unit, i.e. the surface exposed to the environment, and the second surface 42 can be the interior surface, i.e. the surface forming the inside of the structure. Examples of IG units are disclosed in U.S. Pat. Nos. 4,193,236; 4,464,874; 5,088,258; and 5,106,663, herein incorporated by reference. In one embodiment shown in FIG. 3, the PM coating 24 can be positioned on the number 1 or number 4 surfaces, such as on the number 1 surface. The PM coating 24 reduces fogging and makes the IG unit 30 easier to clean and maintain. In this embodiment, one or more optional functional coatings 46 as described above can be deposited over at least a portion of the number 2, number 3, or number 4 surfaces.

Advantages of the present invention over the ion-implantation and sol-gel methods of forming self-cleaning coatings include an ability to form a thin, dense, PM film on a substrate as opposed to the generally thicker, porous self-cleaning coatings obtained with the ion-implantation and sol-gel coating methods. Still another advantage is that the method of providing a PM coating according to the present invention avoids the need to reheat the substrate after application of the coating or coating precursor as is practiced in the conventional ion-implantation and sol-gel methods. Not only does this render the present method less costly and more efficient, e.g., less equipment costs, less energy casts, and less production time, but also the opportunity for sodium ion migration and in turn sodium ion poisoning of the PM coating 24 of the present invention is significantly reduced. Further still, the method of the present invention is easily adapted to the formation of PM coatings on continuous moving substrates, such as a glass float ribbon.

It will be readily appreciated by those skilled in the art that modifications can be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

The invention claimed is:

1. An article, comprising:
a substrate having an inner surface and an outer surface; and
a coating deposited directly on at least a portion of the substrate outer surface,
wherein the coating consists essentially of titania and at least one additional photoabsorption band modifying material selected from vanadium (V), manganese (Mn), magnesium (Mg), scandium (Sc), yttrium (Y), niobium (Nb), molybdenum (Mo), ruthenium (Ru), lead (Pb), nickel (Ni), rhenium (Re), and mixtures thereof,
wherein the coating is a substantially non-porous CVD or MSVD coating, and
wherein an outer surface of the coating is exposed to the environment.

2. The article of claim 1, wherein the substrate is selected from glass, plastic, and ceramic.

3. The article of claim 1, wherein the substrate is selected from annealed glass, tempered glass, and heat strengthened glass.

4. The article of claim 1, wherein the coating comprises titania at least partly in the anatase phase.

5. The article of claim 1, wherein the coating comprises titania at least partly in the rutile phase.

6. The article of claim 1, wherein the coating has a thickness of about 50 Å to about 2000 Å.

7. The article of claim 1, wherein the substantially non-porous coating is sufficiently dense such that the coating withstands a conventional hydrofluoric acid test in which a drop of 0.5 weight percent aqueous hydrofluoric acid solution is placed on the coating and covered with a watch glass for 8 minutes at room temperature.

8. The article of claim 1, wherein the article is an insulating glass unit comprising a first pane spaced from a second pane, and the substrate is at least one of said first pane and said second pane.

9. The article of claim 1, wherein the article is an architectural transparency.

10. The article of claim 1, wherein the substrate is a float glass ribbon.

11. A transparency, comprising:
a substrate having an inner surface and an outer surface, wherein the substrate is selected from annealed glass, tempered glass, and heat strengthened glass; and
a photoactive coating deposited directly on at least a portion of the substrate outer surface, wherein the photoactive coating is a substantially non-porous CVD or MSVD coating,
wherein the photoactive coating consists essentially of titania and at least one additional photoabsorption band modifying material selected from chromium (Cr), vanadium (V), manganese (Mn), copper (Cu), iron (Fe), magnesium (Mg), scandium (Sc), yttrium (Y), niobium (Nb), molybdenum (Mo), ruthenium (Ru), tungsten (W), silver (Ag), lead (Pb), nickel (Ni), rhenium (Re), and mixtures thereof,
wherein an outer surface of the coating is exposed to the environment, and
wherein a photoabsorption band of the photoactive coating extends at least partly into the range of 400 nm to 800 nm of the electromagnetic spectrum.

* * * * *